United States Patent [19]

Malaviya

[11] 4,431,305
[45] Feb. 14, 1984

[54] HIGH DENSITY DC STABLE MEMORY CELL

[75] Inventor: Shashi D. Malaviya, Fishkill, N.Y.

[73] Assignee: International Business Machines Corporation, Armonk, N.Y.

[21] Appl. No.: 288,573

[22] Filed: Jul. 30, 1981

[51] Int. Cl.³ ............................................. G11C 11/40
[52] U.S. Cl. ..................................... 365/174; 357/23; 365/182
[58] Field of Search ............... 365/148, 174, 182, 186; 357/23 R, 58; 307/279

[56] References Cited

U.S. PATENT DOCUMENTS

| 3,914,749 | 10/1975 | Malaviya. | |
|---|---|---|---|
| 4,070,653 | 1/1978 | Rao et al. | 365/222 |
| 4,092,735 | 5/1978 | McElroy | 365/183 |
| 4,122,545 | 10/1978 | Lodi | 365/186 |
| 4,124,111 | 2/1979 | McElroy | 365/178 |
| 4,139,785 | 2/1979 | McElroy | 365/182 |
| 4,142,112 | 2/1979 | Kroger. | |
| 4,352,997 | 10/1982 | Raymond et al. | 365/182 |

OTHER PUBLICATIONS

Mizuno et al., "Theory of Negative Resistance of Junction Field-Effect Transistors", IEEE Journal of Solid-State Circuits, 161.SC-11, No. 2, 4/76, pp. 313-317.
Baliga, "An Improved GAMBIT Device Structure," IEEE Transactions on Electron Devices, vol. ED-25, No. 12, 12/78, pp. 1411-1412.
Thomas, "The NEGIT: A surface-Control Negative Impedance Transistor," IEEE Transactions on Electron Devices, vol. ED-24, No. 8, 8/77, pp. 1070-1076.

Primary Examiner—Stuart N. Hecker
Attorney, Agent, or Firm—John F. Ohlandt; Theodore E. Galanthay; J. Jancin, Jr.

[57] ABSTRACT

An electronic data storage or memory array having DC stable memory cells which utilize the principle of a unique substrate biasing mechanism, whereby a channel region defined by resistive substrate material and formed under a controlled electrode becomes "pinched off" and, in the process, so affects the DC potential at that electrode as to maintain the pinched off condition. Consequently, the memory cell becomes established in a first DC stable state ("one" state). The principle is preferbly embodied in a field effect transistor (FET), the resistive channel region being connected in a DC conductive path to a fixed resistor and a potential source. Accordingly, when appropriate signal levels representing a binary "one" are applied to word and bit lines connected to a first controlling, or gate, electrode and to a second controlling electrode, respectively, of the FET, the described pinch-off occurs, with concomitantly high resistance in the DC path, such that the potential adjacent the controlled electrode is maintained in the "one" state that was initiated by the signals on the word and bit lines. On the other hand, when signals representing a "zero" are applied to the same controlling electrodes, the resistive channel region under the controlled electrode is no longer pinched-off, whereby the memory cell becomes established in the second or "zero" DC stable state. Means for reading the stored data in the cell are integrated with the cell.

11 Claims, 19 Drawing Figures

HIGH DENSITY DC STABLE MEMORY CELL

BACKGROUND OF INVENTION

1. Technical Field

Electronic storage arrays having storage or memory cells formed on integrated circuit chips are well known in the art. A variety of trade-offs must be considered in selecting a particular design for a given application. For example, advantageous features such as high speed and DC stability usually require greater power consumption and a greater area per cell on the integrated circuit chip.

Accordingly, it is a primary object of the present invention to enable a very high density, DC stable memory cell and, in its most preferred embodiment, to include only a single field effect transistor device in such cell to make it compact.

2. Background Information

A variety of approaches have been taken to eliminating the need for refresh circuitry which is necessary in so called dynamic memory cells, thereby to achieve static or DC capability. In order to provide background material so as to enable a full appreciation of the present invention, reference may be made to U.S. Pat. No. 4,142,111 which describes a one-transistor, fully static semiconductor memory cell involving a conventional MOS transistor, along with a field implanted resistance and a vertical P-channel junction type field effect transistor.

Another U.S. patent of interest is No. 3,914,749 of the present applicant, and assigned to the assignee of the present invention. This patent describes a single device DC-stable memory cell comprising a bistable bipolar transistor having a lightly doped base and an emitter of which is substantially coextensive with the base.

Other background material is as follows:
U.S. Pat. No. 3,725,881
U.S. Pat. No. 4,070,653
U.S. Pat. No. 4,092,735
U.S. Pat. No. 4,142,112.
Baliga, "An Improved GAMBIT Device Structure", IEEE Transactions on Electron Devices, volume ED-25, number 12, December 1978, pages 1411-12.
Thomas, "The NEGIT: A Surface-Control Negative Impedance Transistor", IEEE Transactions on Electron Devices, volume ED-24, number 8, August 1977, pages 1070-1076.

The present invention is also related to an invention of applicant entitled "Electronic Storage Array Having DC Stable Conductivity Modulated Storage Cells" filed Dec. 28, 1979 Ser. No. 107,812, assigned to the assignee of the present invention. The invention of this related application includes an electronic storage array with DC stage cells. However, such cells relay on the principle of conductivity modulation in a region adjacent the base region of a transistor device.

Whatever the merits of the cited references, they do not disclose the principle of the present invention which relies on the aforenoted channel pinch-off effect by a controlled electrode, such electrode being controlled by the "write" pulse input to the memory cell; the pinch-off effect acting to establish the cell in one of two stable states.

SUMMARY OF THE INVENTION

In fulfillment of the aforenoted objects, it is a primary feature of the present invention that DC stable memory cells are realized by a biasing mechanism which relies on channel pinch-off in a semiconductor area or region adjacent a controlled electrode of an integrated device within a common isolation region of a substrate. This channel pinch-off results in substantially altering the impedance or resistance in a DC current path. Such alteration results in substantially changing the DC potential at such controlled electrode whereby the active element performing the storage or memory function is maintained in the DC state into which it has been placed by the dynamic signals applied to a word and bit line. It will become apparent as the description proceeds that the stable DC state of the cell depends upon the particular potential levels selected for the word and bit line.

In its most preferred embodiment, the DC stable memory cell includes only a single field effect transistor in which the channel pinch-off is effectuated adjacent to the drain electrode thereof. However, other embodiments are disclosed in which plural transistors are involved, one of them being a junction field effect transistor whose emitter or gate is the controlled electrode which produces the required pinch-off effect.

Other and further objects, advantages and features of the present invention will be understood by reference to the following specification in conjunction with the annexed drawing, wherein like parts have been given like numbers.

DESCRIPTION OF PREFERRED EMBODIMENTS

The present invention provides a storage or memory cell having the advantageous features of DC stability, non-destructive read-out, and high density in integrated circuit form. DC stability is provided by reason of the pinch-off control of a resistive channel integrated in the substrate adjacent a controlled electrode of the storage element. In accordance with a first embodiment This resistive channel is disposed in a DC conductive path, a node of that path being connected to the controlled electrode by a suitable means, such as a p-n junction. This resistive channel normally has a low resistance in a first stable state such that the potential at the controlled electrode is normally low, defined as the zero state. However, when the potential signal levels at a first controlling electrode and a second controlling electrode are changed, due to appropriate activation of the word and bit lines respectively, the resistive channel region is pinched off with the result that a relatively high potential then exists and is maintained at said controlled electrode.

Figure 1:
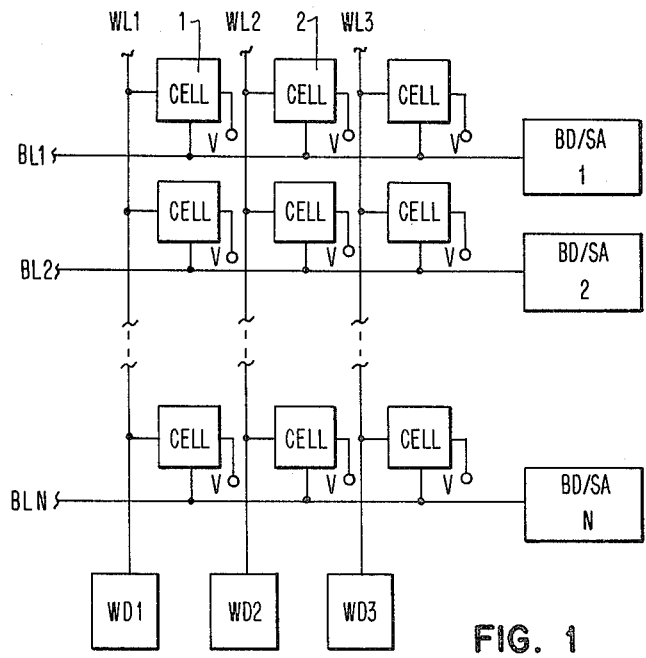
FIG. 1 is a block diagram of an array of memory cells.

Referring now to FIG. 1, there is illustrated an array of cells in accordance with the present invention. For purposes of illustration, only nine cells are shown in the drawing. In actual practice, however, thousands of such cells are contained on a single semiconductor integrated chip. This arrangement of cells, per se, does not differ from the prior art. Each cell is connected to a word line WL and a bit line BL. Each word line is connected to a word drive WD, while each bit line is connected to a bit drive/sense amplifier BD/SA. Each cell also requires a fixed bias potential, as is indicated by the V terminal. This V terminal does not have to be a separate connection to each cell. Instead, it can be shared with adjacent cells.

Figure 2:
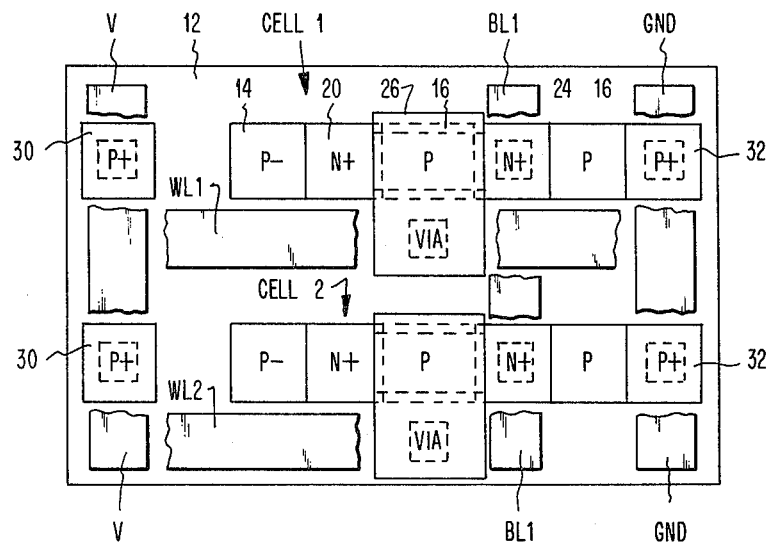
FIG. 2 is a top view of two adjacent memory cells in accordance with a first memory cell embodiment, such cells being adapted for incorporation in the array of FIG. 1.
Figure 3:
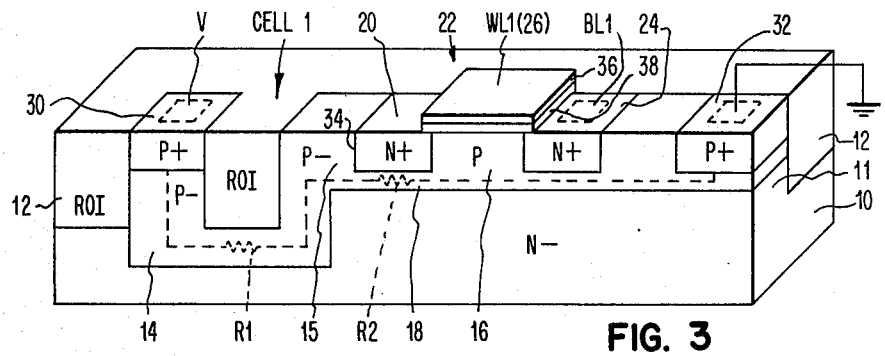
FIG. 3 is a vertical cross section in three dimensions of one of the memory cells of FIG. 2.

Referring now to FIGS. 2 and 3, there is illustrated one type of storage cell in accordance with my invention, adapted for use in the particular array arrangement of FIG. 1; that is to say, an array which involves two access lines: a word line and a bit line. It will be understood that once the cell structure depicted in FIGS. 2 and 3 is illustrated, those skilled in the art will be able to use various known semiconductor processes or techniques for fabricating it. For purposes of illustration, the major steps of one such process will now be outlined. This process is compatible with the conventional bipolar process so that the peripheral circuits of the memory array can use bipolar transistors for high performance.

A P-type silicon monocrystalline substrate (not shown), is doped with boron impurities at about $10^{14}$ atoms per cc. Known lithographic processing techniques are then utilized for selectively introducing N-type impurities, usually arsenic, to form an N+ subcollector region (not shown). P-type impurities are also introduced in a similar manner for isolating the various subcollector regions (not shown). Thereafter, as seen in FIG. 3, a layer 10 of N-type monocrystalline silicon is epitaxially deposited on the substrate. Heat cycle causes the N+ subcollector and the P+ isolation to out diffuse into the epitaxial layer 10 as usual (not shown). The portion of the N-type epitaxial layer 10 remaining in FIG. 3 after subsequent processing steps is N− region 11. The doping level of this region 11 is approximately 2 times $10^{16}$ atoms per cc.

After the epitaxial layer is deposited, recessed oxide isolation (ROI) 12 is provided. This ROI is interposed to increase the series resistance of the P-region 14 in order to conserve power. One technique for forming the ROI region is by diffusing an oxygen-containing atmosphere at high temperatures through a suitably masked surface, thereby driving oxygen atoms into the silicon material and converting it in-situ to silicon dioxide.

To this point, the described process is not unlike similar processes for formation of single isolated bipolar and FET devices. However, the memory cell of the present invention requires a special configuration. A relatively high doping level is required in the P region 16 under the gate of the FET to control its threshold voltage, but a relatively low doping level is preferred for the P− region 14. As indicated in FIG. 3, by means of dotted lines, the P− region 14 provides the fixed resistor $R_1$, also seen in the equivalent circuit diagram of FIG. 4. The P− region 15 provides the variable resistance $R_2$, also seen in FIG. 4. It should be noted that the latter resistor is defined in particular by a channel portion 18 located immediately adjacent and underneath the N+ electrode 20 which constitutes the controlled electrode of the active device 22. This active device also comprises a first controlling electrode 24 and a second controlling or gate electrode 26.

It will be apparent to those skilled in the art that the structural configuration of FIG. 3 can be achieved in a number of different ways. For example, the entire P region could receive a P− doping level with region 16 receiving a subsequent heavier doping of P−type impurities. Alternatively, the several regions can be formed by completely separate photolithographic steps. As will be apparent, the location of the interface between the regions 16 and 14 should preferably fall under the controlled electrode 20. As will also be apparent, some resistance is always present in the conductive path due to the material in region 16; however, the important variable effect occurs in the channel portion 18 resulting in raising the value of the resistance $R_2$ when the channel becomes pinched off as will be explained.

The regions previously noted, that is the N+ region 20 constituting the controlled electrode and N+ region 24 constituting the second controlling electrode, are formed in conventional manner by suitable masked diffusion of appropriate impurities into the substrate surface. Likewise, the other electrodes namely P+ electrode 30 at the left end and P+ electrode 32 at the right end are similarly formed by the use of heavy doping with P-type impurities at the surface.

Figure 4:
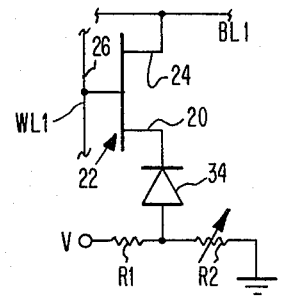
FIG. 4 is an equivalent circuit diagram of the memory cell depicted in FIG. 3.
Figure 5:
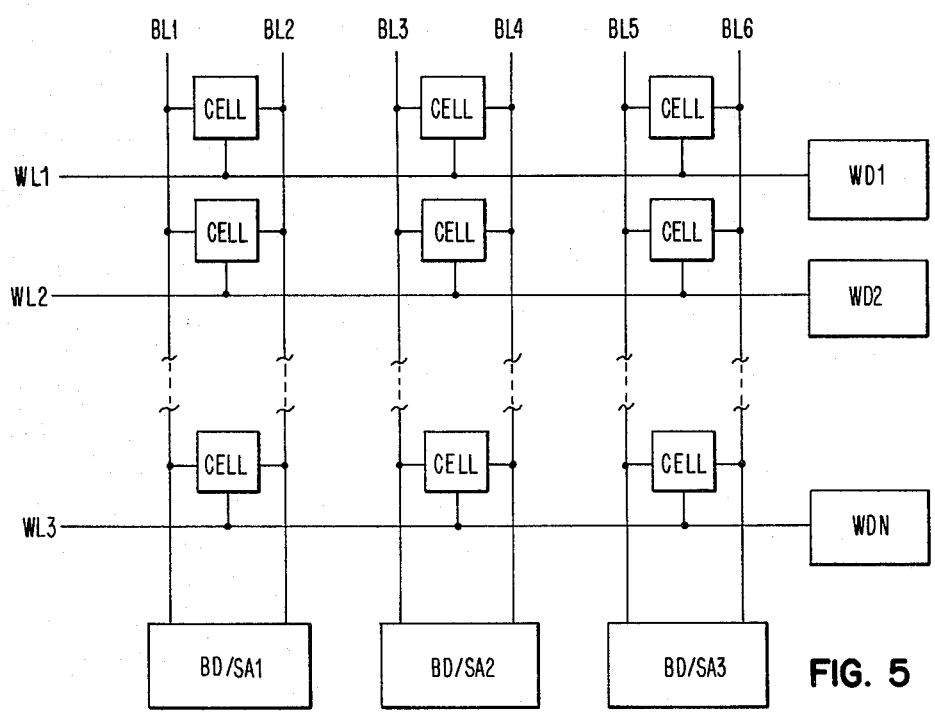
FIG. 5 is a block diagram of an array of memory cells in which three lines are utilized; specifically, one word line and two bit lines.

It will be seen that, in addition to the $R_1$ and $R_2$ components in the first conductive path of the equivalent circuit of FIG. 4 already noted, that potential source V, seen in FIG. 3, is connected to the electrode 30; while electrode 32 is connected to ground. The upper portion of the P− region located adjacent the controlled electrode 20 defines with that electrode a junction diode 34, seen in the equivalent circuit of FIG. 4.

The word line WL 1 is seen connected to the gate or controlling electrode 26 which, as will be understood, is typically constituted of a suitable conductive layer 36 and a thin insulating layer 38 at the surface of the FET device 22. The bit line BL1 is connected to the other controlling electrode 24.

The nature of the entire structural monolith of which the memory cell of FIG. 3 would form a part can be appreciated by referring to FIG. 2 in which the top plan view of such a monolith with two memory cells is shown. Specifically, two adjacent word lines WL1, WL2, and one bit line BL1 are shown. Corresponding regions have been identified by corresponding reference numerals; and the respective areas identified as contact areas correspond to the interface regions, such as a contact between the V metal line with region 30 in cell 1; the ground metal line with region 32; and the bit and word lines with their respective regions such as the word line WL1 contacting the gate electrode 26 by way of a first to second metal via opening.

The operation of the memory cells as bistable circuit elements, and more particularly the storage or memory cell, such as cell 1 in the integrated circuit array of FIG. 1, may be understood by reference to the equivalent circuit of FIG. 4. Included therein is a first conductive path comprising the potential source V, the resistor $R_1$ of fixed value and the variable resistor $R_2$ which is connected to ground. As explained previously, the resistance $R_1$ is constituted of the semiconductor material in the region 14 up to the interface with channel 18; whereas the resistance of $R_2$ consists of the channel 18 and the P region 16 extending over to the P+ electrode 32 as seen in FIG. 3.

Resistor $R_2$ is the critical or significant resistance element whose resistance or impedance is altered substantially when the word line WL1 and bit line BL1 have such voltage levels applied to them as to cause the channel 18 to be pinched off. As a consequence, the resistance of $R_2$ rises substantially, thereby increasing the potential of the anode of diode 34 (FIG. 4) close to that of the supply voltage V which is approximately 5 volts. This in turn holds the drain electrode 20 at about +4.3 volts at which it remains when the gate 26 is turned off. This voltage of +4.3 volts is sufficient to keep the channel 18 pinched off and so the "1" state of the cell is DC stable.

When zero is written into the cell, the source electrode 24 is brought down to zero volts and the channel 18 becomes open; that is to say, it is then conducting. Consequently, the P— region immediately adjacent the drain electrode 20 is held close to zero volts. This state is also DC stable.

Figure 16:
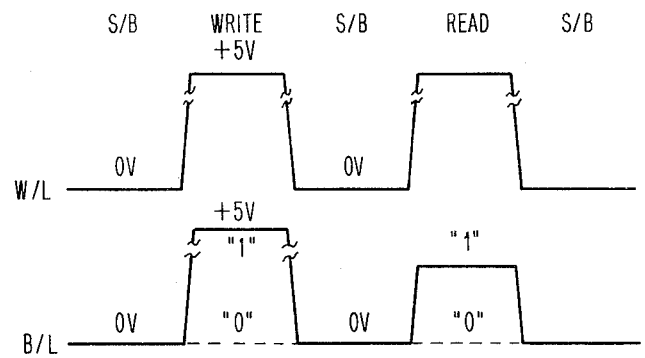
FIG. 16 through FIG. 19 are waveforms for the read, write, and standby operations with respect to the word

It will be apparent from reference to FIG. 16 that the required conditions for the writing of a "1", involving the pinching off of the channel 18, are realized by utilizing waveforms of the character illustrated. Thus, in writing a "1" into the cell the word line has its voltage level raised to five volts and likewise the bit line is raised to five volts. On the other hand, when it is desired to read the information present in the cell, the word line potential is raised to five volts. The bit line tends to be more positive with a stored "one" than with a stored "zero", and the stored data can therefore be read by conventional methods. The other potential levels, indicated as SB, are the standby levels.

To sum up, the operation of the cell is as follows (referring to FIGS. 3 and 4):

1. The gate 26 of the IGFET 22 is made sufficiently positive by the selected word line to switch it on.
2. The voltage of the bit line, connected to the source (controlling electrode 24) of the IGFET, is transferred to its drain (controlled electrode 20).
3. If the data is a "0", the bit line voltage is low, the drain voltage is therefore low and the channel 18 under the drain is not pinched off.
4. If the data is a "1", the bit line voltage is high, the drain voltage is therefore high—sufficient to pinch off the channel 18 under it.
5. If the channel 18 is pinched off, the voltage of the P— region to the left of the N+ drain 20 (FIG. 3) is high, which in turn maintains the drain at a high voltage by diode action and the pinch-off is sustained.
6. If the channel 18 is not pinched off, the voltage of the P— region to the left of the N+ drain (FIG. 3) is low and there is no pinch-off under it. Hence the drain voltage remains low.

Referring now to FIGS. 5 through 8, another form of memory cell array is illustrated. This particular array is arranged to include two bit lines for each of the memory cells as well as a word line. Thus, it is a three access line scheme.

Figure 6:
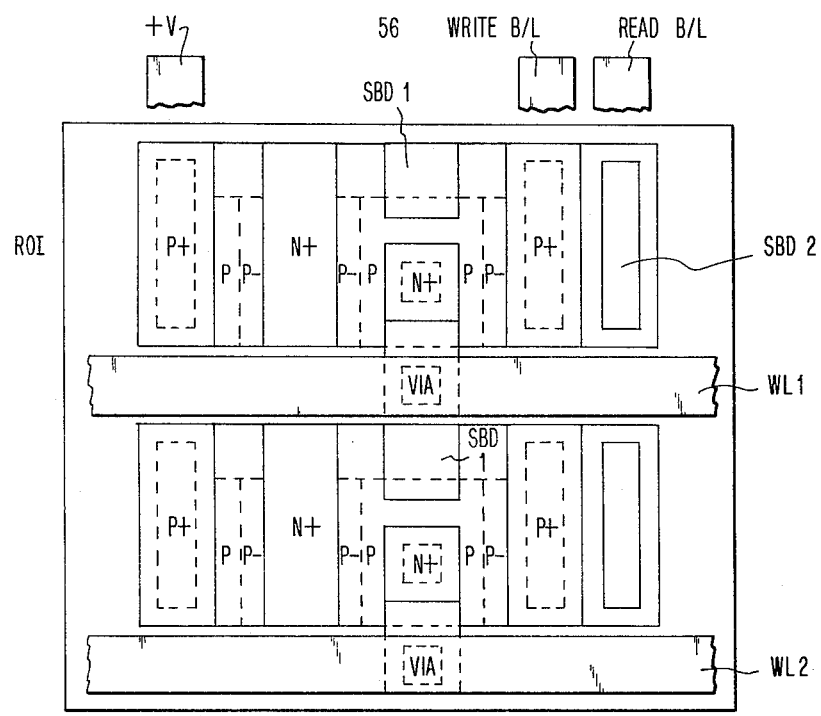
FIG. 6 is a top view of two adjacent memory cells in integrated form and adapted for use in the particular memory array of FIG. 5.
Figure 7:
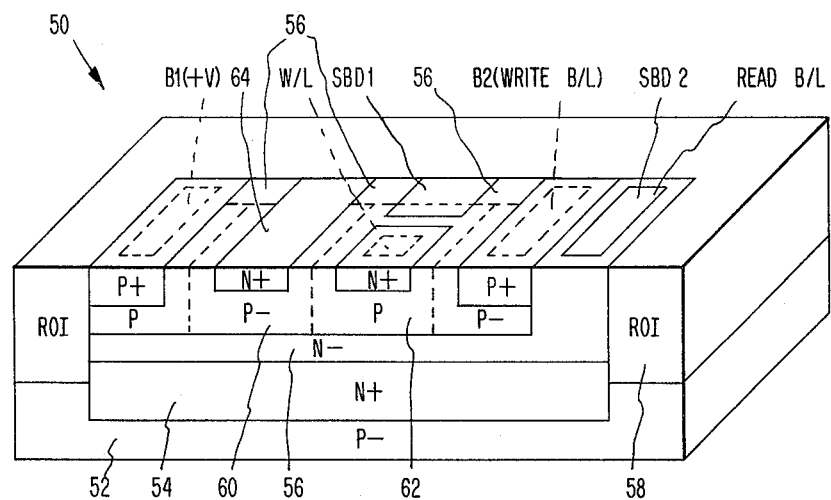
FIG. 7 is a vertical cross section in three dimensions of one of the memory cells of FIG. 6.
Figure 8:
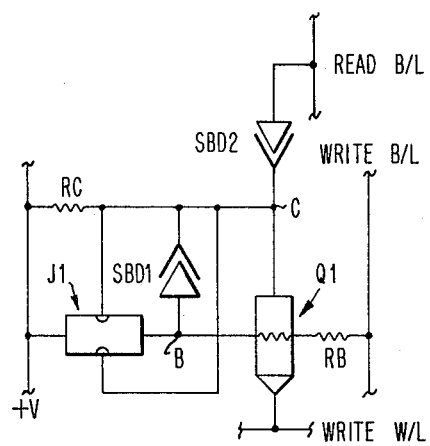
FIG. 8 is an equivalent circuit diagram of the memory cell depicted in FIG. 7.
Figure 17:
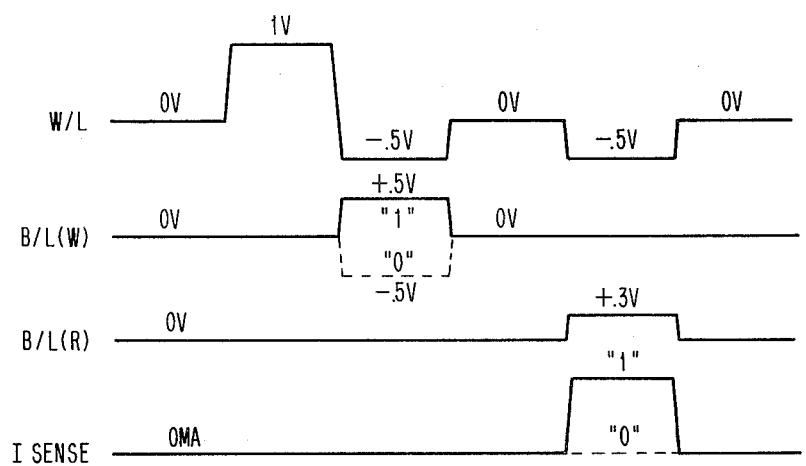
Figure 18:
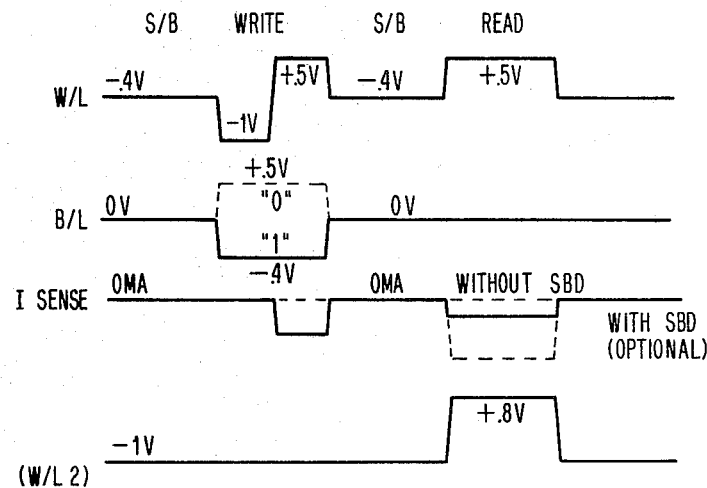
Figure 19:
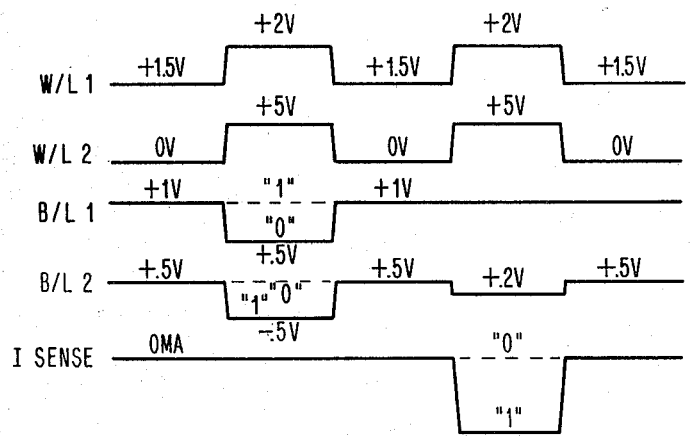

The particular embodiment illustrated in FIGS. 6-8 is a second preferred embodiment of the memory cell. This memory cell is adapted for incorporation in the array of FIG. 5. In particular, FIG. 6 shows the horizontal geometry, FIG. 7 the three dimensional view and FIG. 8, the equivalent electrical circuit. Illustrative voltage levels for the different conditions of operation are shown in FIG. 17. It is understood that actual levels will depend upon the usual design considerations and device characteristics.

The monolithic structure 50 in FIG. 7 contains a single memory cell which has been formed in a P— substrate 52 by well known techniques, as already explained, of creating an N+ subcollector 54 and an N— epitaxial layer 56. The memory cell area is delimited, for example, by a recessed oxide isolation region 58, along with P+ diffused isolation rings around the subcollectors, as usual.

As before, the P conductivity layer is subdivided into two regions; one laabeled 60 is lightly doped (P—), whereas the other labeled 62 is more heavily doped (P). The P— region 60 shown on either side of the emitter 64 can be obtained, for example, by omitting the first ion implant out of two which may be used in the process for the P conductivity. Also, an emitter 64 (called the gate) is placed over the left portion of the P— region 60, as shown in FIG. 7. By extending the gate N+ diffusion beyond the edge of the base and into the epi, we ensure that the N+ gate gets shorted to the collector C as shown in FIG. 8.

The P+ masks can be aligned with the edges of base contacts B1 and B2 and the usual outdiffusion can be relied on to extend it a little further. Similarly, the P base mask may be aligned with the edges of the emitter on both the left and right edges, and outdiffusion will move out the P regions to enclose the emitter.

A Schottky diode SBD1 is formed between the base and the epi; and a second Schottky diode SBD2 is formed between the read bit line and the collector as shown in FIG. 7.

Operation of this embodiment can be summarized as follows, referring to FIGS. 6, 7, and 8:

Write Cycle

Bring up the write word line to +1 V to ensure that all the cells are off. Collector C goes up to +1.5 V because of the external resistor $R_c$. JFET J1 is thus pinched off and the base B is held at 0 V by the write bit line which is normally held at zero volt. The read bit line is also normally held at zero volt. However, it may be made even more negative (e.g. −0.5 V) during the write cycle to ensure that it is off (SBD2 is off). Bring the selected write word line to say, −0.5 V and the write bit lines to +0.5 V for a "1" and to 0 V for a "0". Q1 will conduct for "1" and will remain off for a "0". J1 will be on for a "1" but will remain pinched off for a "0". Bring the write word line to zero volt at the end of the cycle.

Read Cycle

Bring down the write word line (which is also the read word line) to −0.5 volt and read the currents in the bit lines, if low barrier Schottkies are used for SBD2. If high barrier ones are used, raise the bit line voltages to about +0.3 volt during the read cycle (to ensure large read or sense signal for a "1"). There will be a large DC sense signal for a "1" because Q1 is on; otherwise the current will be negligible, the collector C being at +1.5 V for the off devices.

It is to be noted that standby power may be conserved by lowering the voltage on +V for the inactive cells by making it as another set of (write or powering up) word line. Also, it will be understood that line +V is held at +1.5 volt unless otherwise stated.

Figure 11:
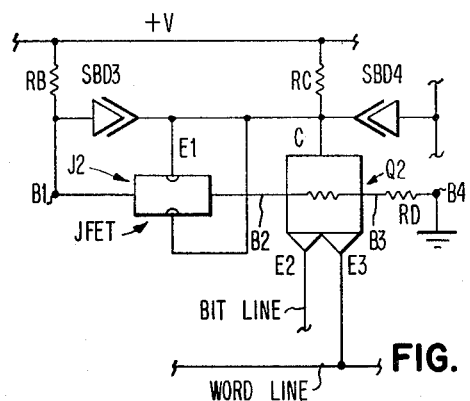
FIG. 11 is an equivalent circuit diagram of the memory cell depicted in FIG. 9.
Figure 9:
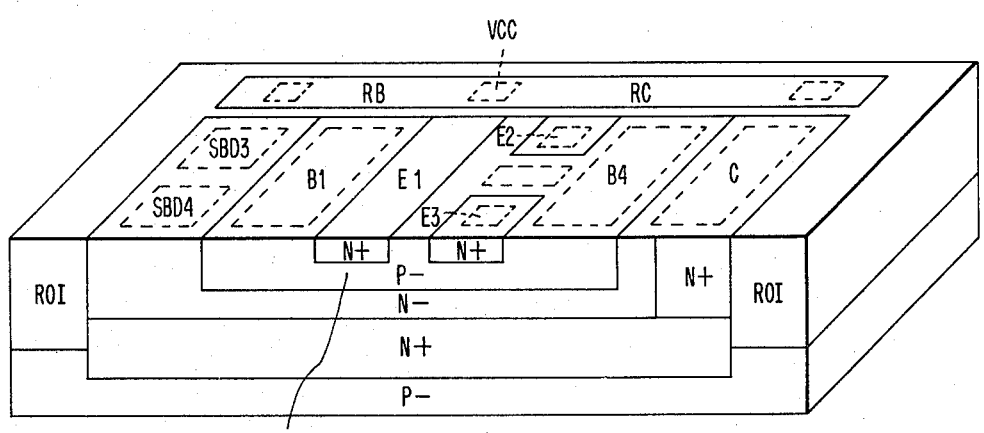
FIG. 9 is a vertical cross section in three dimensions of a third embodiment of a memory cell in accordance with the present invention.
Figure 10:
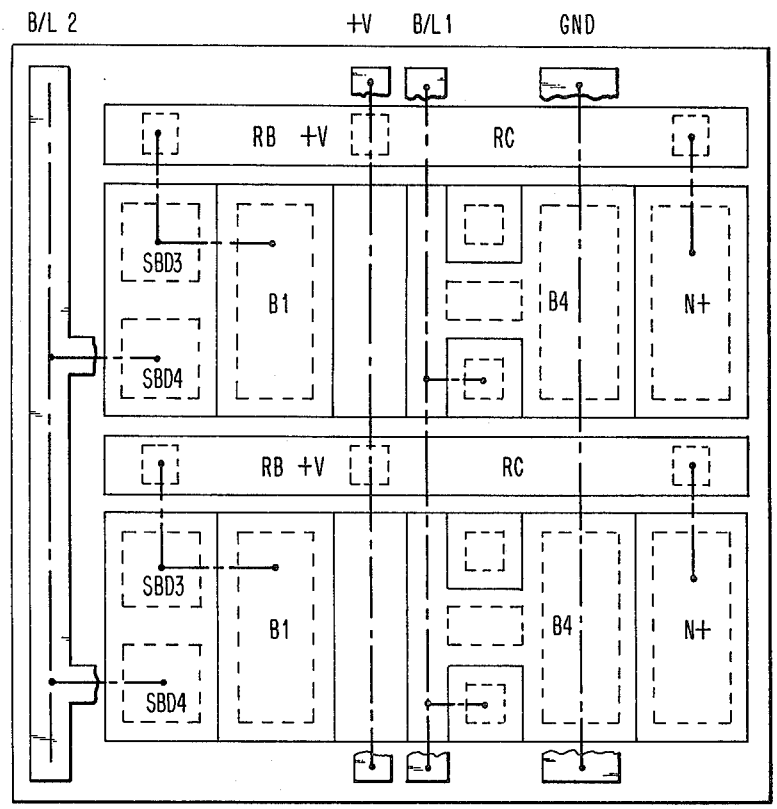
FIG. 10 is a top view of two adjacent memory cells such as the one illustrated in FIG. 9.

Referring now to FIGS. 9 to 11, a third embodiment of a memory cell will be described. FIG. 10 shows the horizontal geometry, FIG. 9 shows the vertical profile and FIG. 11 shows the electrical equivalent circuit of the memory cell. It consists of a double emitter, Schottky clamped (SBD3) double-base contact type of regular NPN bipolar device, with associated base and collector resistances connected to the +V supply as shown. An additional Schottky diode SBD4 is also shown as an optional feature for design flexibility. The third emitter E1 of FIG. 11 is used as the gate of an associated junction FET, with the collector of transistor Q2 as its other gate and the P− base 70 as its channel. Low voltage operation will require low doped P− material in this region.

Interconnections between the elements of the cell are shown in FIG. 11. $R_D$ is the series resistance between the intrinsic base of the bipolar device and its external contact B4. Ion implantation may be used here also to increase its value for conserving power.

The two DC stable states of the cell are as follows:

The on state

Q2 is on because one of the two emitters E2 or E3 or both are at a suitable low voltage e.g. zero volt, or −0.5 volt. Since the device Q2 is on, the collector voltage is low and the gates E1 of the JFET designated J2, being connected to the collector, are also at a low voltage. The channel of the JFET is thus open, making the base positive via $R_B$. This in turn maintains the device Q2 in its on state. The cell is therefore DC stable in the on state.

The off state

Q2 is off, the collector is at the +V level and so are the gates E1 of J2. J2 is thus off and the positive supply to the base is cut off. The base is then held at the ground potential by B4 via $R_D$.

With the emitters still at zero or −0.5 volt, the device will continue to remain off. The off state is also therefore DC stable.

Operation as a memory cell

Bring the selected word line down to about −0.85 volt to make all the cells conduct because of B4 and/or E3. Keep the selected bit lines down, others up, and bring up the word line to, say zero volt, or +0.5 V. The selected cells will remain on, others will turn off because both of the emitters are up. To read the cell, hold the bit lines at say, −0.5 volt and the word line at zero volt for the selected case, all other word lines at say −0.65 volt. Read the currents in the bit lines. The positive supply may be enhanced during the read out to improve the access time. Another possibility is to raise the voltage on the anode of the Schottky diode SBD3 to increase the output current during read out.

Yet one more option is to use a single emitter and make B4 the word line. To write, we raise the selected word line by about 0.4 V, with others left at 0 V; the selected bit lines are brought down to about −0.5 V, others left at 0 V. Raise the anode voltage of SBD3 (read word line) and monitor the bit line current for data. We can also make the emitter as the word line, B4 as the write word line and the anode of SBD3 as the read bit line.

The fourth and final embodiment of the invention is briefly described below (reference FIGS. 12-15).

Figure 15:
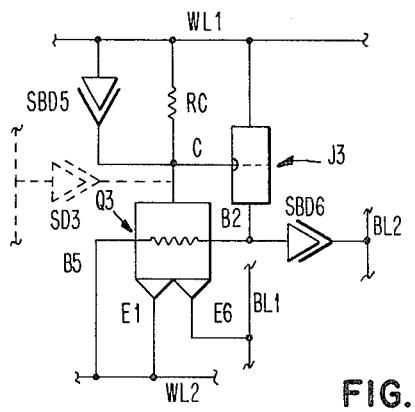
FIG. 15 is an equivalent circuit diagram of the memory cell depicted in FIG. 13.

As in the third embodiment, the memory cell uses a double emitter, double base contact NPN transistor Q3 with an N-type Schottky barrier diode SBD5 integrated into its collector as well as P-type Schottky barrier diode SBD6 integrated into its base (FIG. 15). The JFET J3 is connected across the upper word line WL1 and the collector. An external collector resistor $R_c$ is also required in the cell.

Figure 12:
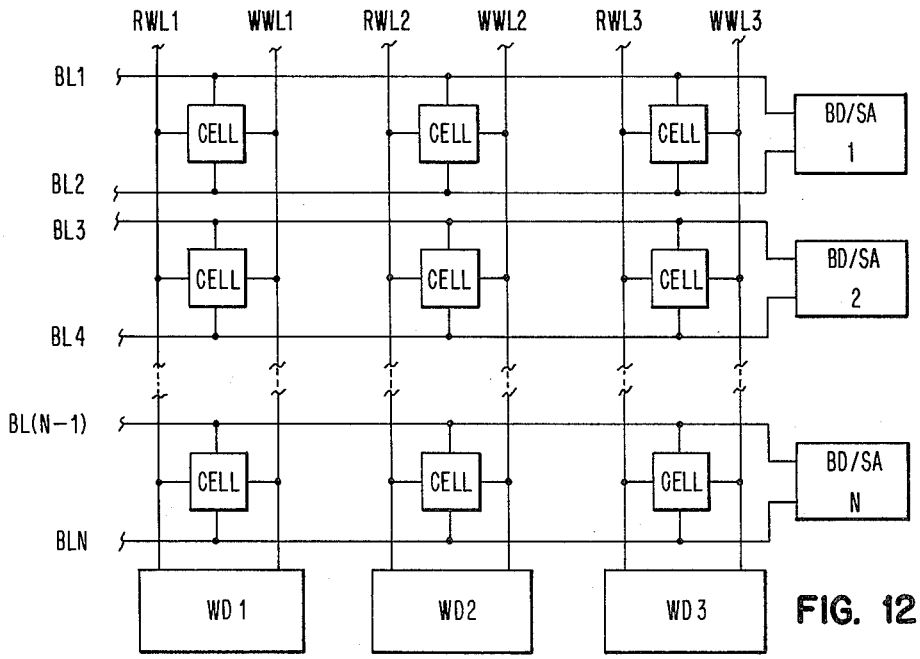
FIG. 12 is a block diagram of an array of memory cells having four lines.
Figure 13:
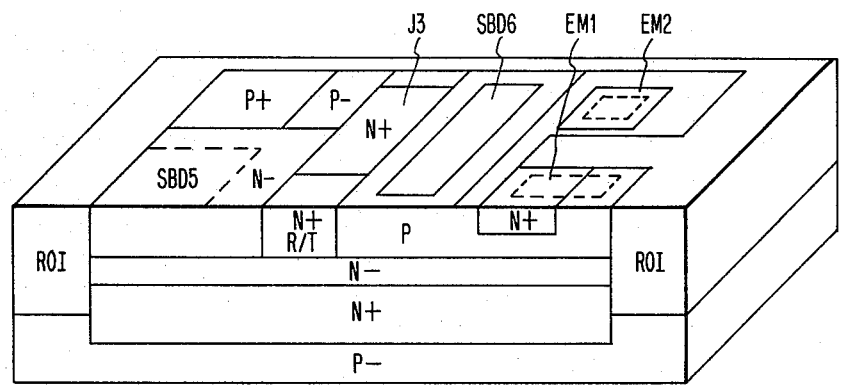
FIG. 13 is a vertical cross section of a third embodiment of a memory cell suitable for incorporation in the array of FIG. 12.
Figure 14:
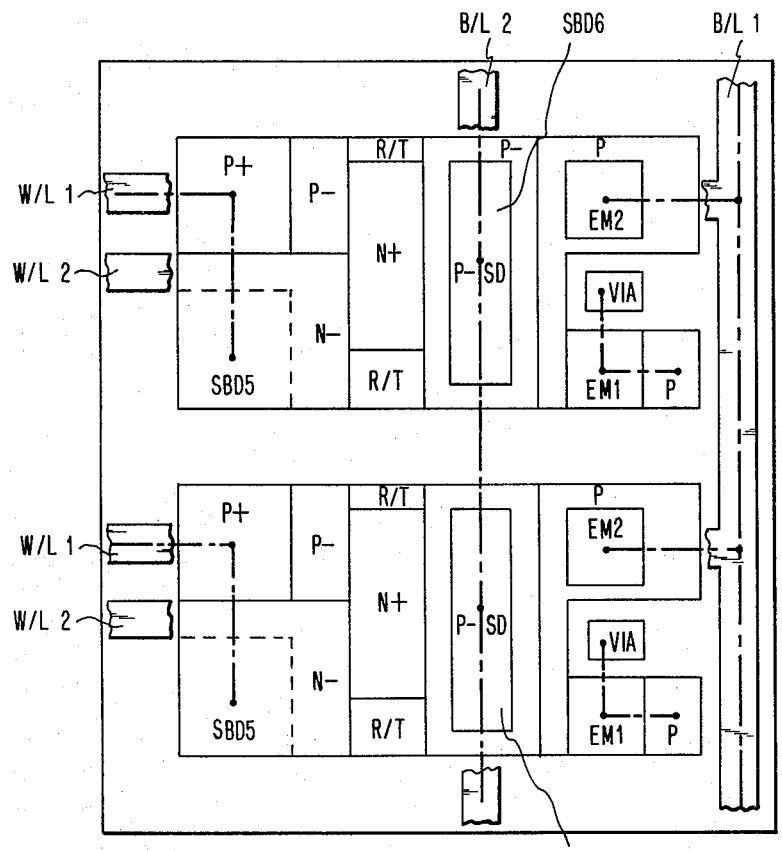
FIG. 14 is a top view of two adjacent memory cells like the one cell depicted in FIG. 13.

A typical layout of the cell and interconnections with adjacent cells in the word and bit lines are illustrated in FIGS. 12-14.

Operation of the cell is briefly as follows:

If the transistor Q3 is off, collector C is up, hence the gate of J3 is up, therefore J3 is off, and the positive supply to the base of Q3 is cut off. The base of Q3 is held down via the base pinched resistor, the other end of which is connected to the lower word line WL2. A butted emitter structure is necessary for this embodiment, otherwise an external resistor will be required between B5 and the lower word line. The off state of the cell is thus DC stable.

If the transistor Q3 is on, the collector C is down, J3 is on, supplying positive bias to the base of Q3. This state of the cell is thus also stable. To write a "zero", the lower word line WL2 and BL1 are both raised up to suitably positive levels. To write a "one", the lower word line WL2 is raised positive as before, but the bit line 1 is now made negative to turn on the base-emitter (E6) junction of Q3. To read, the lower word line WL2 is raised up, and/or the bit line BL1 is lowered and the current in it is read.

Alternately, the P− Schottky diode SBD6 may be used to turn off the device by raising the lower word line as before, and lowering the bit line BL2. Conduction of the P− Schottky diode SBD6 robs the base of Q3 of its current and turns it off quickly.

What has been disclosed is the unique memory cell and an array in which such memory cells are incorporated. Such cells are based on a biasing mechanism which relies on channel pinch-off in a semiconductor area or region adjacent to a controlled electrode of a integrated device. This channel pinch-off results in substantially altering the impedance in a DC current path, such alteration resulting in substantially changing the DC potential at such controlled electrode whereby the active element forming the storage or memory function is maintained in the DC state into which it has been placed by the dynamic signals applied to a word and bit line.

While there have been shown and described what are considered at present to be the preferred embodiments of the present invention, it will be appreciated by those skilled in the art that modifications of such embodiments may be made. It is therefore desired that the invention not be limited to these embodiments, and it is intended to cover in the appended claims all such modifications as fall within the true spirit and scope of the invention.

I claim:

1. A DC-stable memory cell comprising:
an integrated junction field effect transistor, having a controlled electrode and first and second controlling electrodes, said controlled electrode being the gate electrode of said junction field effect transistor;
a resistor having a fixed value of resistance coupled to said controlled electrode of said transistor;
at least one word line and at least one bit line connected to said memory cell;
said controlled electrode being held at one of two DC stable potential levels, indicative of one of two binary states, as a function of voltage levels applied by means of the word line and the bit line; and
a variable impedance means integrated in a channel adjacent to said controlled electrode, the impedance of said variable impedance means being altered by the controlled electrode, which is operable to pinch off said channel responsive to a set of voltage levels applied by means of the word line and the bit line, such that when said variable impedance is at a low impedance the memory cell is sustained in a first binary state, and when said variable impedance is at a high impedance the memory cell is sustained in a second binary state.

2. A memory cell as defined in claim 1, in which there is provided a conductive path including said variable impedance means and a potential source;
said conductive path also including said resistor having a fixed value of resistance, and means for connecting to said potential source;
the resistor of fixed value being connected to a node common to said variable impedance means, the other end of said variable impedance means being connected to reference potential.

3. A method cell as defined in claim 2, in which the potential level at said node is effective to hold the controlled electrode at a potential which keeps the cell in the selected state.

4. A DC-stable integrated memory array having a plurality of memory cells, each memory cell comprising:
an integrated junction field effect transistor, having a controlled electrode and first and second controlling electrodes, said controlled electrode being the gate electrode of said junction field effect transistor;
a resistor having a fixed value of resistance coupled to said controlled electrode of said transistor;
at least one word line and at least one bit line connected to said memory cell;
said controlled electrode being held at one of two DC stable potential levels, indicative of one of two binary states, as a function of voltage levels applied by means of the word line and the bit line; and
a variable impedance means integrated in a channel adjacent to said controlled electrode, the impedance of said variable impedance means being altered by the controlled electrode, which is operable to pinch off said channel responsive to a set of voltage levels applied by means of the word line and the bit line, such that when said variable impedance is at a low impedance the memory cell is sustained in a first binary state, and when said variable impedance is at a high impedance the memory cell is sustained in a second binary state.

5. A memory array as defined in claim 4, in which each of the memory cells is provided with a conductive path including said variable impedance means and a potential source;
said conductive path also including said resistor having a fixed value of resistance, and means for connecting to said potential source;
the resistor of fixed value being connected to a node common to said variable impedance means, the other end of said variable impedance means being connected to reference potential.

6. A memory array as defined in claim 5, in which the potential level of said node is effective to hold the controlled electrode at a potential which keeps the cell in the selected state.

7. A DC-stable, integrated memory array having a plurality of memory cells, each memory cell comprising:
a power supply terminal for providing a fixed potential level;
an integrated junction field effect transistor, having a controlled electrode and first and second controlling electrodes, said controlled electrode being the gate electrode of said junction field effect transistor;
a resistor having a fixed value of resistance coupled to said controlled electrode of said transistor;
at least one word line and at least one bit line connected to said memory cell;
said controlled electrode being held at one of two DC stable potential levels, indicative of one of two binary states, as a function of voltage levels applied by means of the word line and the bit line; and
a variable impedance means integrated in a channel adjacent to said controlled electrode, the impedance of said variable impedance means being altered by the controlled electrode, which is operable to pinch off said channel responsive to a set of voltage levels applied by means of the word line and the bit line, such that when said variable impedance is at a low impedance the memory cell is sustained in a first binary state, and when said variable impedance is at a high impedance the memory cell is sustained in a second binary state.

8. A memory array as defined in claim 7, in which in each of said memory cells there is provided a conductive path including said variable impedance means,
said conductive path also including said power supply terminal, said resistor having a fixed value of resistance, and means for connecting said resistor to said power supply terminal;
the resistor of fixed value being connected to a node common to said variable impedance means, the other end of said variable impedance means being connected in said reference potential.

9. A memory array as defined in claim 8, in which the potential level at said node is effective to hold the controlled electrode at a potential which keeps the cell in the selected state.

10. A DC-stable memory cell comprising:
an integrated transistor having a controlled electrode and first and second controlling electrodes;
a resistor having a fixed value of resistance coupled to said controlled electrode of said transistor;
at least one word line and at least one bit line connected to said memory cell;
said controlled electrode being held at one of two DC stable potential levels, indicative of one of two binary states, as a function of voltage levels applied by means of the word line and the bit line; and
a variable impedance means integrated in a channel adjacent to and immediately below said controlled electrode, the impedance of said variable impedance means being altered by the controlled electrode, which is operable to pinch off said channel responsive to a set of voltage levels applied by means of the word line and the bit line, such that when said variable impedance is at a low impedance the memory cell is sustained in a first binary state and when said variable impedance is at a high impedance the memory cell is sustained in a first binary state and when said variable impedance is at a high impedance the memory cell is sustained in a second binary state.

11. A DC-stable, integrated memory array having a plurality of memory cells, each memory cell comprising:
a power supply terminal for providing a fixed potential level;
an integrated transistor having a controlled electrode and first and second controlling electrodes;
a resistor having a fixed value of resistance and coupled between said power supply terminal and said controlled electrode of said transistor;
at least one word line and at least one bit line connected to said memory array;
the first controlling electrode of the transistor being coupled to the word line of said memory array;
the second controlling electrode of said transistor being coupled to the bit line of said memory array;
said controlled electrode being held at one of two DC stable potential levels, indicative of one of two binary states; as a function of voltage levels applied by means of the word line and the bit line; and
a variable impedance means integrated in a channel adjacent to and immediately below said controlled electrode, the impedance of said variable impedance means being altered by the controlled electrode, which is operable to pinch off said channel responsive to a set of voltage levels applied by means of the word line and the bit line, such that when said variable impedance is at a low impedance the memory cell is sustained in a first binary state and when said variable impedance is at a high impedance the memory cell is sustained in a second binary state.

* * * * *

UNITED STATES PATENT AND TRADEMARK OFFICE
CERTIFICATE OF CORRECTION

PATENT NO. : 4,431,305
DATED : February 14, 1984
INVENTOR(S) : Shashi D. Malaviya It is certified that error appears in the above-identified patent and that said Letters Patent are hereby corrected as shown below:

In the Abstract:

Line 10, "preferbly" should read --preferably--

Column 1, line 54, "stage" should read --stable--;

"relay" should read --rely--.

In the Claims:

Claim 3, line 1, "method" should read --memory--.

Signed and Sealed this

Eighth Day of May 1984

[SEAL]

Attest:

GERALD J. MOSSINGHOFF

Attesting Officer

Commissioner of Patents and Trademarks